US012566147B2

(12) United States Patent
Sun et al.

(10) Patent No.: US 12,566,147 B2
(45) Date of Patent: Mar. 3, 2026

(54) TEST APPARATUS AND METHOD

(71) Applicant: SANECHIPS TECHNOLOGY CO., LTD., Guangdong (CN)

(72) Inventors: Niuyi Sun, Guangdong (CN); Dan Yang, Guangdong (CN); Na Mei, Guangdong (CN); Tuobei Sun, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 203 days.

(21) Appl. No.: 18/565,582

(22) PCT Filed: Mar. 14, 2022

(86) PCT No.: PCT/CN2022/080690
§ 371 (c)(1),
(2) Date: Nov. 30, 2023

(87) PCT Pub. No.: WO2022/252743
PCT Pub. Date: Dec. 8, 2022

(65) Prior Publication Data
US 2024/0264104 A1 Aug. 8, 2024

(30) Foreign Application Priority Data
Jun. 3, 2021 (CN) .......................... 202110621034.2

(51) Int. Cl.
*G01N 27/04* (2006.01)
*G01R 31/26* (2020.01)
*G01R 31/28* (2006.01)

(52) U.S. Cl.
CPC ......... *G01N 27/045* (2013.01); *G01N 27/041* (2013.01); *G01R 31/26* (2013.01); *G01R 31/28* (2013.01)

(58) Field of Classification Search
CPC ........ G01N 27/00; G01N 27/02; G01N 27/04; G01N 27/041; G01N 27/045; G01R 31/00;
(Continued)

(56) References Cited

U.S. PATENT DOCUMENTS 5,291,419 A * 3/1994 Satoh ....................... G01N 3/00
                                                            702/34
9,091,610 B2 * 7/2015 Hisakuni ................. G01M 7/00
(Continued)

FOREIGN PATENT DOCUMENTS

CN        108664669 A     10/2018
CN        110658403 A     1/2020
(Continued)

OTHER PUBLICATIONS

WIPO, International Search Report issued on May 20, 2022.
(Continued)

*Primary Examiner* — Hoai-An D. Nguyen
(74) *Attorney, Agent, or Firm* — Li & Cai Intellectual Property (USA) Office

(57) ABSTRACT

Disclosed is a test apparatus, including: a connection circuit having a plurality of mounting positions each configured to connect a sample; a detection unit configured to perform a detection on the sample; and a control unit configured to control the detection unit to perform the detection on the sample. Further disclosed is a test method, including: connecting a sample to a mounting position of a test apparatus; and perform a test on the sample with the test apparatus.

12 Claims, 4 Drawing Sheets

(58) Field of Classification Search
CPC .... G01R 31/26; G01R 31/28; G01R 31/2801;
G01R 31/281; G01R 31/2817
USPC ................................. 324/600, 649, 691, 693
See application file for complete search history.

(56) References Cited

U.S. PATENT DOCUMENTS

| | | | | |
|---|---|---|---|---|
| 9,451,709 | B2 * | 9/2016 | Monda ................. | H05K 3/3436 |
| 11,656,266 | B2 * | 5/2023 | He ..................... | G01R 31/2601 |
| | | | | 702/58 |
| 12,032,039 | B2 * | 7/2024 | Saeki ..................... | G01R 31/71 |
| 2010/0327892 | A1 | 12/2010 | Agarwal et al. | |
| 2013/0312523 | A1 * | 11/2013 | Hisakuni ................. | G01M 7/00 |
| | | | | 73/577 |
| 2022/0105583 | A1 * | 4/2022 | Saeki ....................... | G01N 3/60 |

FOREIGN PATENT DOCUMENTS

| | | | | | | |
|---|---|---|---|---|---|---|
| CN | 112305311 | A | | 2/2021 | | |
| JP | 2000131376 | A | | 5/2000 | | |
| JP | 2002158265 | A | | 5/2002 | | |
| JP | 2003172767 | A | | 6/2003 | | |
| JP | 2006024646 | A | | 1/2006 | | |
| JP | 2013032931 | A | * | 2/2013 | ............ | G01N 17/00 |
| JP | 2018084468 | A | | 5/2018 | | |
| JP | 2019102473 | A | | 6/2019 | | |
| KR | 100283937 | B1 | * | 3/2001 | .............. | G01N 3/18 |
| KR | 101588963 | B1 | | 1/2016 | | |

OTHER PUBLICATIONS

Jingjing Xiao. "Development of Multi-LED Accelerated Life Test System," Master's Thesis, Xiamen University, May 2017.
Japan Patent Office, first Office action dated Dec. 17, 2024, for corresponding JP application No. 2023-573242.

* cited by examiner

Mount a sample — S201

Configure parameters — S202

Start a test — S203

Increase the temperature — S204

Aging stage — S205

Start a detection stage — S206

Detection stage — S207

End the detection stage — S208

All samples failed? — S209
No
Yes

Decrease the temperature — S210

Output a result — S211

TEST APPARATUS AND METHOD

CROSS-REFERENCE TO RELATED APPLICATIONS

This application is a National Phase Application filed under 35S U.S.C. 371 as a national stage of PCT/CN2022/080690, filed on Mar. 14, 2022, an application claiming the priority to the patent application No. 202110621034.2 filed with the China Patent Office on Jun. 3, 2021, the entire contents of which are incorporated hereby by reference.

TECHNICAL FIELD

The present disclosure relates to, but is not limited to, the field of testing technology.

BACKGROUND

There are many soldering points in an electronic product, such as die-to-substrate soldering points in a chip (IC), soldering points between a mainboard and various components of a printed circuit board (PCB), etc., and these soldering points may be in the form of controlled collapse chip connection (C4) bumps, ball grid array (BGA) balls, or the like.

As time goes on (aging), the soldering points may fail due to electromigration or the like, and further affect performance of the electronic product. Therefore, aging performance of the soldering points has an important effect on the package reliability, board level reliability, and the like of the electronic product. In order for an aging test on the soldering points, aging of the soldering points may be accelerated by heating and the like, so that reliability indexes such as a characteristic service life, an overcurrent limit and the like of a batch of soldering points can be obtained.

However, a soldering point aging test of convenient operation, stable output and high measurement precision is still unavailable now.

SUMMARY

The present disclosure provides an apparatus and method for soldering point aging test.

In a first aspect, the present disclosure provides a test apparatus, including: a connection circuit having a plurality of mounting positions each configured to connect a sample; a detection unit configured to perform a detection on the sample; and a control unit configured to control the detection unit to perform the detection on the sample.

In a second aspect, the present disclosure provides a test method, including: connecting a sample to a mounting position of the test apparatus as described herein; and performing a test on the sample with the test apparatus.

DETAIL DESCRIPTION OF EMBODIMENTS

Figure 1:
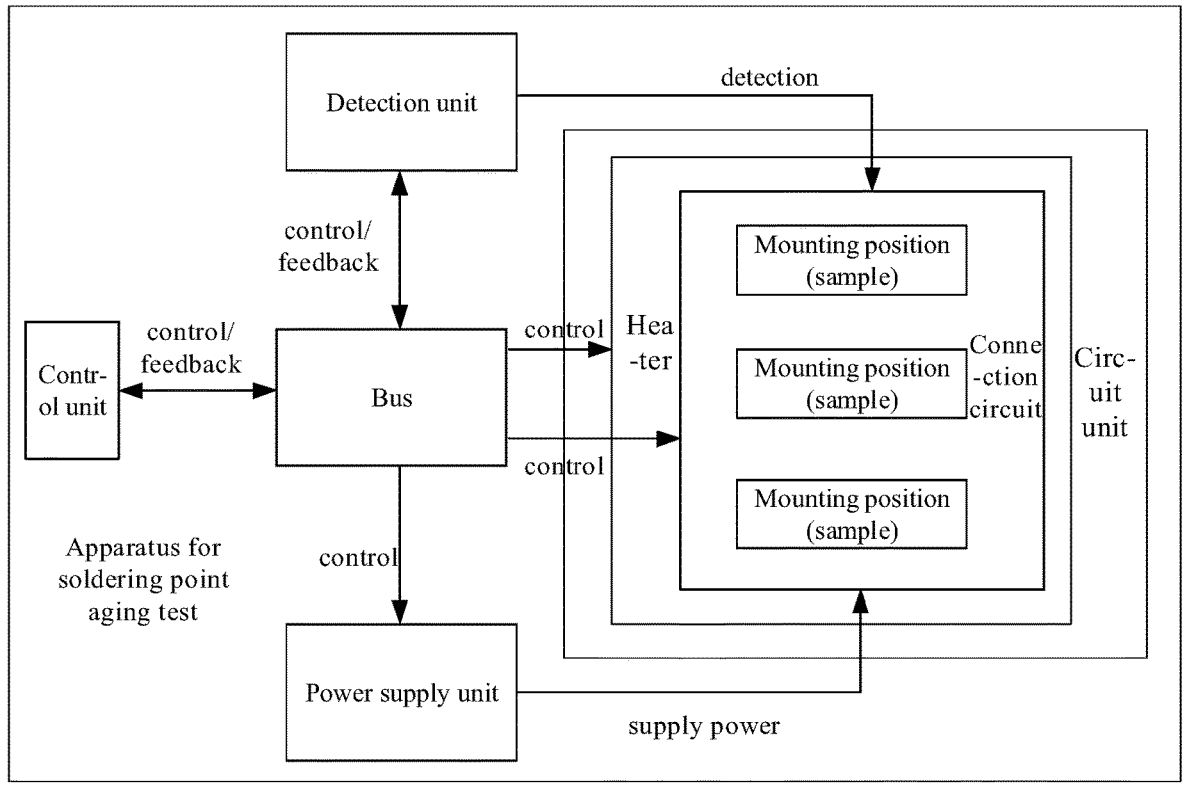
FIG. 1 is a block diagram of an apparatus for soldering point aging test according to the present disclosure.

In order to make those skilled in the art better understand the technical solutions of the present disclosure, the following describes the apparatus and method for soldering point aging test provided in the implementations of the present disclosure in detail with reference to the accompanying drawings.

The present disclosure will be described more sufficiently below with reference to the accompanying drawings, where the illustrated implementations may be embodied in different forms. However, the present disclosure should not be construed as being limited to the implementations set forth herein. Rather, these implementations are provided so that the present disclosure will be thorough and complete, and will fully convey the scope of the present disclosure to those skilled in the art.

The accompanying drawings are provided for further understanding of the implementations of the present disclosure and constitute a part of the specification. Hereinafter, these drawings are intended to explain the present disclosure together with the detailed implementations, but should not be considered as a limitation to the present disclosure. The above and other features and advantages will become more apparent to those skilled in the art by describing the detailed implementations with reference to the accompanying drawings.

The present disclosure may be described with reference to plan views and/or cross-sectional views by way of idealized schematic representations of the present disclosure. Accordingly, the example illustrations may be modified in accordance with manufacturing techniques and/or tolerances.

Implementations of the present disclosure and features thereof may be combined with each other without conflict.

The terminology used in the present disclosure is for the purpose of describing particular implementations only and is not intended to be limiting of the present disclosure. As used herein, the term "and/or" includes any and all combinations of one or more of the associated listed items. As used in the present disclosure, the singular forms "a", "an" and "the" are intended to include the plural forms as well, unless the context clearly indicates otherwise. As used herein, the terms "include" and "made of . . . " specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the existing art and the present disclosure, and will not be interpreted in an idealized or overly formal sense unless expressly so defined in the present disclosure.

The present disclosure is not limited to the implementations shown in the drawings, but includes modifications of configurations formed based on a manufacturing process. Therefore, the regions illustrated in the figures have schematic properties, and the shapes of the regions shown in the figures illustrate specific shapes of regions of elements, but are not intended to be limitative.

In a first aspect, referring to FIGS. 1 to 4, the present disclosure provides an apparatus for soldering point aging test.

The apparatus for soldering point aging test of the present disclosure is configured to test aging performance of a soldering point in a sample, so as to evaluate a service life and an overcurrent capability for electromigration reliability of the soldering point, or implement daily monitoring on electromigration reliability of the soldering point, or detect a quality of the sample, or the like.

Figure 2:
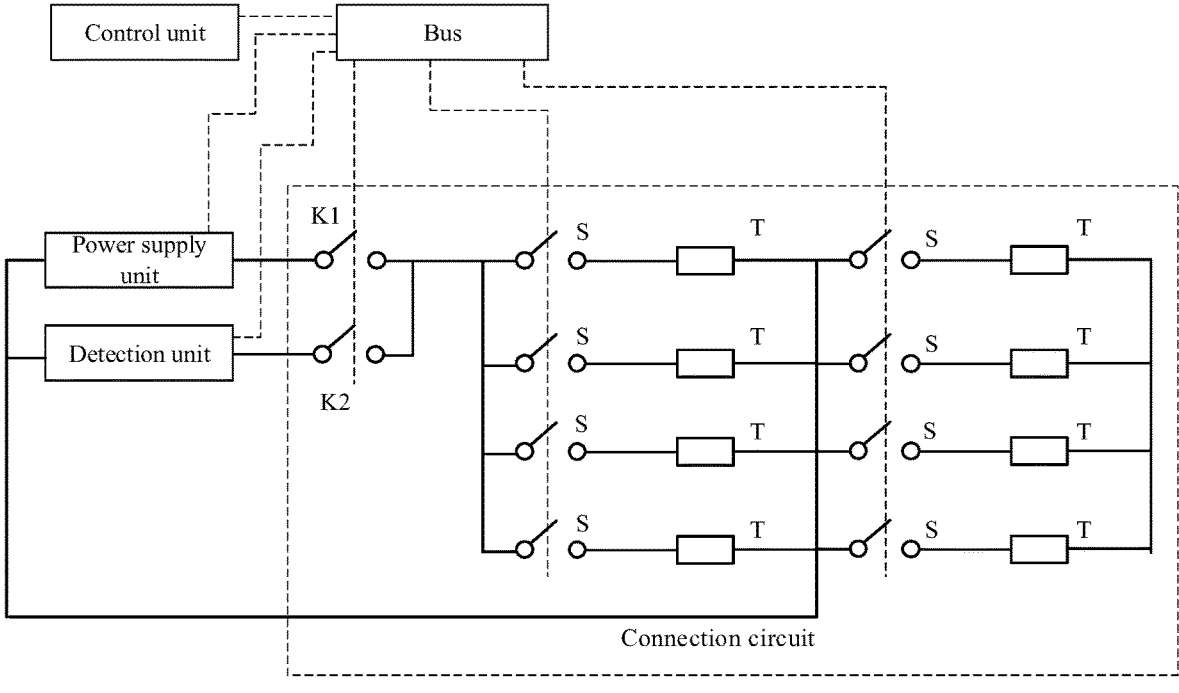
FIG. 2 is a schematic circuitry diagram of an apparatus for soldering point aging test according to the present disclosure.

Referring to FIGS. 1 and 2, the apparatus for soldering point aging test of the present disclosure includes: a circuit unit including a heater and a connection circuit having a plurality of mounting positions T each configured to connect a sample having a soldering point, where the heater is configured to heat the sample; a power supply unit configured to supply power to the connection circuit to cause aging of the soldering point due to a current generated in the sample; a detection unit configured to perform a detection on an electrical property of the sample to implement an aging test on the soldering point in the sample; and a control unit configured to control the power supply unit to supply power to the connection circuit when the apparatus is in an aging stage, and to control the detection unit to perform the detection on the electrical property of the sample when the apparatus is in a detection stage.

The sample here is a device under test (DUT) that has at least one soldering point, which may be an actual electronic product such as a chip or a printed circuit board, or a test product specifically used for testing, or a test module configured to contain an actual electronic product therein, or the like.

The apparatus for soldering point aging test of the present disclosure includes a circuit unit in which a preset connection circuit (such as a test board in the form a printed circuit board, which may be disposed on a stage) is provided. The connection circuit includes a plurality of mounting positions T configured to connect samples. When a sample is connected to one of the mounting positions T, the sample is supported by the stage and equivalently forms a part of the connection circuit.

The specific form of the mounting position T connecting the sample may vary. For example, original input and output ends of the sample may be connected, or a specified test end of the sample is connected, or a specified position of the sample is directly connected, as long as the sample is electrically connected into the connection circuit, and a current can flow through the soldering point in the sample.

The circuit unit further includes a heater which can heat at least the sample at the mounting position T, so as to apply a certain temperature stress on the sample according to requirements in the aging stage, and thus accelerate aging of the soldering point in the sample. For example, the test board and the stage mentioned above may be both disposed in an oven (heater).

The circuit unit is not limited to the forms of test board, stage, and oven as described above, as long as it can provide a connection circuit having mounting positions T and can heat the sample in the connection circuit.

The power supply unit is configured to supply power to the connection circuit so that a current flows through the sample connected therein, and to accelerate aging of the soldering point by applying a preset current stress.

Thereby, through the combined action of the heater and the power supply unit, the aging process of the soldering point in the sample under long-term natural use can be simulated in a shorter time.

The detection unit is configured to perform a detection on an electrical property of the sample in a detection stage after aging. The electrical property naturally reflects a property of the soldering point in the sample. In other words, the detection unit may detect a property of the soldering point in the sample after aging, that is, perform an aging test.

The control unit is configured to control other units to implement the aging stage and the detection stage and the like according to a preset flow.

The control unit may be a "terminal" (for example, a computing device, a tablet, a laptop, a personal digital assistant, etc.) which may have preset test conditions, control signals, and the like stored therein, and may send control signals to other units and receive data fed back from other units, process the data (for example, analyze the detected data to obtain a detection result), and output (for example, display or send the detection result), and so on.

Referring to FIG. 1, the circuit unit, the power supply unit, the detection unit, the control unit, and the like described above may be each connected to a bus (e.g., a control bus), so that the control unit can send control signals to other units and receive data fed back from other units through the bus.

The bus communication is not necessary (for example, wireless communication is also possible), as long as the control unit can implement bidirectional data communication with the circuit unit, the power supply unit and the detection unit.

In the present disclosure, a sample having a soldering point may be mounted in a connection circuit (e.g., a test board) of a circuit unit, and heated by a heater (e.g., an oven), while being supplied with power through a power supply unit that generates a current to accelerate aging, and a detection unit performs a detection on the sample to determine a property of the sample after aging of the soldering point thereof, thereby completing a soldering point aging test. Moreover, the whole test process is automatically implemented under the control of a control unit (such as a terminal), without any human intervention or influence, so that a soldering point aging test of convenient operation, stable output and high measurement precision is achieved.

In some implementations, the power supply unit includes a plurality of constant current power supplies; and the control unit is configured to control output currents of the plurality of constant current power supplies when the apparatus is in an aging stage.

The power supply unit described above may be a plurality of constant current power supplies, so that a stable current can be provided according to the form, the number and the like of the samples to be aged in the connection circuit, and each sample can obtain the desired stable current and be subjected to the desired current stress.

The power supply unit may also be a constant current power supply in other forms, or a constant voltage power supply, or any other power supply.

In some implementations, the detection unit is configured to detect a resistance of the sample.

The detection unit described above may be a resistance detection device configured to detect a resistance value of the sample, and since the resistance often changes significantly when a soldering point fails due to electromigration, the aging test can be implemented by detecting the resistance.

The detection unit may be further configured to detect other electrical properties such as a voltage, a current and the like, as long as the detected electrical property of the sample can reflect the aging condition of the soldering point therein.

In some implementations, the control unit is configured to control the apparatus to enter the aging stage and the detection stage in an alternative manner.

Figure 3:
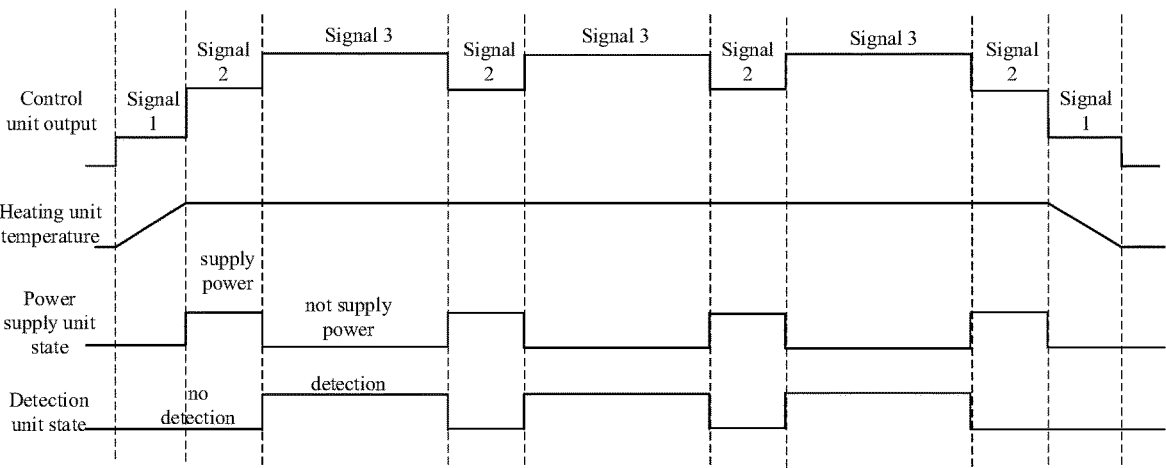
FIG. 3 is a schematic diagram showing states of various structures at various time periods in a method for soldering point aging test according to the present disclosure.
Figure 4:
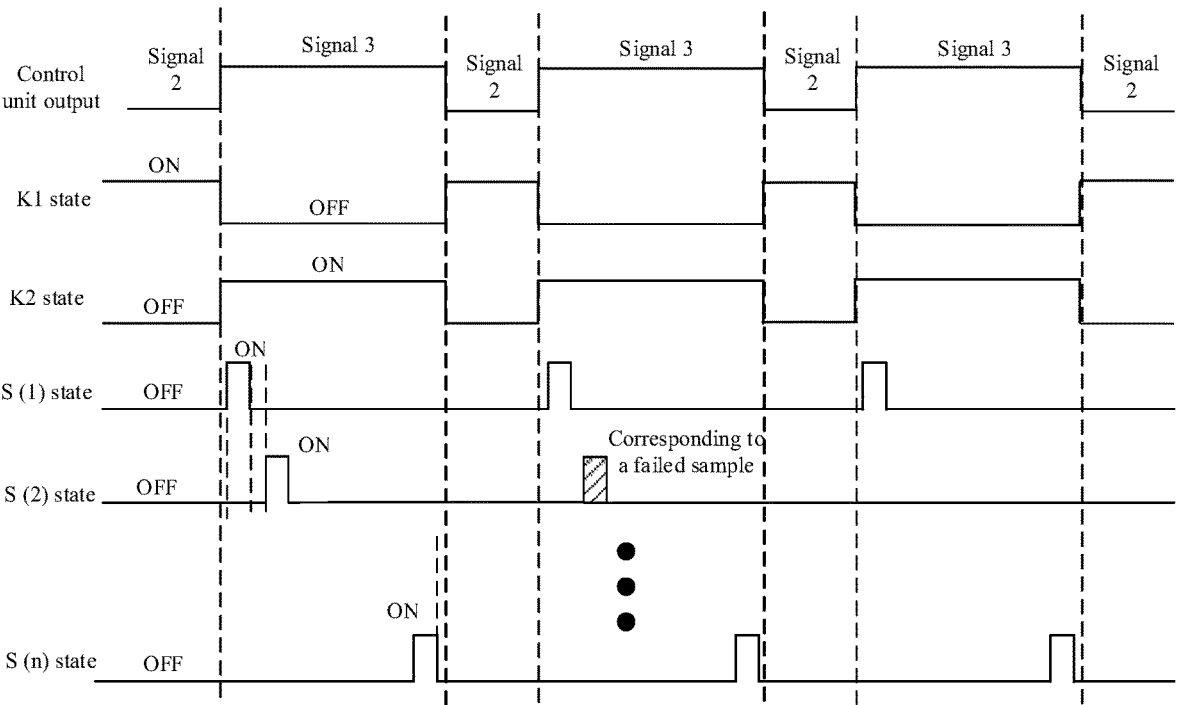
FIG. 4 is a schematic diagram showing states of various switches in an aging stage and a detection stage in a method for soldering point aging test according to the present disclosure.
Figure 5:
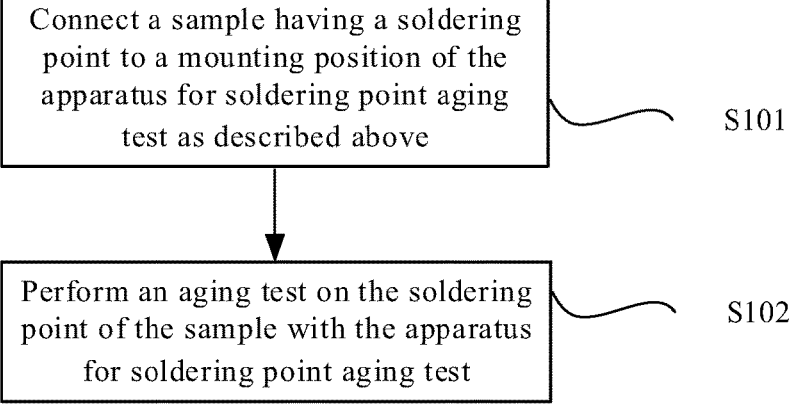
FIG. 5 is a flowchart of a method for soldering point aging test according to the present disclosure.

Referring to FIGS. 3 and 4, a detection stage may be implemented each time an aging stage lasts for a certain time period, and then another aging stage, so on and so forth. In this manner, if a soldering point of a certain sample is found to be failed for the first time in a certain detection stage, it can be determined that the soldering point is failed in the previous aging stage, and therefore, the time for each soldering point in each sample to fail due to aging can be more accurately determined.

For example, the aging stage and the detection stage may be alternated, until all the samples are found to be failed in a certain detection stage (or a preset maximum aging time is reached), then the test is ended, and distribution of failure time of the samples (e.g., a batch of electronic products) is determined.

However, the specific arrangement of the aging stage and the detection stage is not limited thereto. For example, the detection stage may be implemented only once after the aging stage lasts for a relatively longer predetermined time, where a sample that is not failed in the detection stage is considered to be qualified while a sample that is failed in the detection stage is considered to be unqualified, and then the test is ended.

In some implementations, the control unit is configured to control the detection unit to be disconnected from the connection circuit when the apparatus is in the aging stage; and the control unit is configured to control the power supply unit to be disconnected from the connection circuit when the apparatus is in the detection stage.

Referring to FIG. 3, in the aging stage, the power supply unit supplies power to the connection circuit, while the detection unit may be disconnected from the connection circuit (i.e., no detection); and in the detection stage, when the detection unit performs the detection, the power supply unit may be disconnected from the connection circuit (i.e., not supply power).

The connection between the units in the aging stage and in the detection stage is not limited to the above forms. For example, the detection unit may perform the detection while the power supply unit supplies power to the connection circuit (in which case the detection stage is also the aging stage).

In some implementations, the connection circuit includes a plurality of parallel connection branches each provided with a mounting position T and a connection switch S in series; the plurality of parallel connection branches are connected to the power supply unit via a power supply branch provided with a power switch K1; the plurality of parallel connection branches are connected to the detection unit via a detection branch provided with a detection switch K2; and the control unit is configured to control the connection switch S, the power switch K1, and the detection switch K2.

Referring to FIG. 2, as an exemplary implementation of the present disclosure, the connection circuit may include a plurality of parallel connection branches each provided with a mounting position T (configured to connect a sample) and a connection switch S for controlling on/off of the connection branch. All the parallel connection branches are connected to the power supply unit and the detection unit through a power switch K1 and a detection switch K2, respectively.

For example, referring to FIG. 2, each connection branch has one end directly connected to the power unit and the detection unit (for example, connected to one pole thereof), and the other end connected to the power unit and the detection unit (for example, connected to the other pole thereof) via the power switch K1 and the detection switch K2.

Therefore, by controlling the power switch K1 and the detection switch K2, whether the power unit and the detection unit are connected to the connection circuit, namely whether to implement detection or aging, can be controlled. Further, by controlling the respective connection switches S, it is possible to determine which samples are in the path, that is, which samples are to be aged and detected.

In some implementations, the control unit is configured to control the connection switch S of each connection branch with a sample to be tested to be turned on, the power switch K1 to be turned on, and the detection switch K2 to be turned off when the apparatus is in the aging stage; and the control unit is configured to control the connection switch S of each connection branch with a sample to be tested to be turned on, the power switch K1 to be turned off, and the detection switch K2 to be turned on when the apparatus is in the detection stage.

Among all the samples currently in the connection circuit, the detection may be not required to be performed on all samples. For example, if a sample has been found to be failed in a previous detection, it does not need to perform the detection on the sample again thereafter, or if a sample is mounted into the connection circuit for current balance, it does not need to perform the detection on the sample, either. After various samples which are actually not desired to be further detected are removed, the remaining samples which are desired to be detected in subsequent stages after the current detection are called "sample(s) to be tested (or sample(s) to be detected)".

Referring to FIGS. 3 and 4, in the aging stage, the power switch K1 may be controlled to be turned on while the detection switch K2 may be turned off (so that the detection unit is disconnected from the connection circuit), and the connection switch S of a connection branch where the sample desired to be aged (the sample to be tested) is located may be controlled to be turned on, so as to age the selected sample.

In the detection stage, the detection switch K2 may be controlled to be turned on while the power switch K1 may be controlled to be turned off (so that the power supply unit is disconnected from the connection circuit), and the connection switch S of a connection branch where the sample desired to be detected (the sample to be tested) is located may be controlled to be turned on, so as to perform a detection on the selected sample.

In some implementations, the control unit is configured to control connection switches S of all the connection branches with samples to be tested to be turned on one by one in turn each time the device is in the detection stage.

Referring to FIG. 4, in each detection stage, the connection switches S of all the connection branches where the samples desired to be detected (samples to be tested) currently are located may be controlled to be turned on one by one. In other words, only one connection switch S is turned on at a time, and all the connection switches S corresponding to the samples to be tested are turned on once in this detection stage. Therefore, in each detection stage, the detection can be performed on all the samples to be tested one by one.

In some implementations, the control unit is configured to keep, upon a failed soldering point being detected in any sample, the connection switch S of the connection branch where the sample is located off.

When a failed soldering point is detected in a sample in a certain detection stage, the detection is not performed on the sample any more, and the control unit can therefore keep the connection switch S of the connection branch where the sample is located off (until a next detection is started), and the soldering point is not aged or detected any more.

Apparently, the specific control modes of the switches may vary.

For example, in a certain detection stage, a detection may be performed on only a part of samples (so that only the connection switches S corresponding to the part of samples to be tested are turned on); or, a detection may be performed on a plurality of samples simultaneously (so that a plurality of connection switches S corresponding to these samples are simultaneously turned on); or, an individual detection may be further performed on each of a plurality of samples (i.e., to determine the specific failed sample) only when there is an abnormality in the overall detected data (e.g., a total resistance) of the plurality of samples (i.e., there may be a failed sample among these samples); or, a sample with a failed soldering point may be further subjected to aging, detection, and the like.

In a second aspect, referring to FIGS. 1 to 6, the present disclosure provides a method for soldering point aging test.

The method for soldering point aging test of the present disclosure is implemented by the apparatus for soldering point aging test described above, and, referring to FIG. 5, may include the following operations S101 to S102.

At operation S101, a sample having a soldering point is connected to a mounting position T of the apparatus for soldering point aging test as described above.

At operation S102, an aging test is performed on the soldering point of the sample with the apparatus for soldering point aging test.

The method for soldering point aging test of the present disclosure can ensure convenient operation, stable output and high measurement precision of the test.

Figure 6:
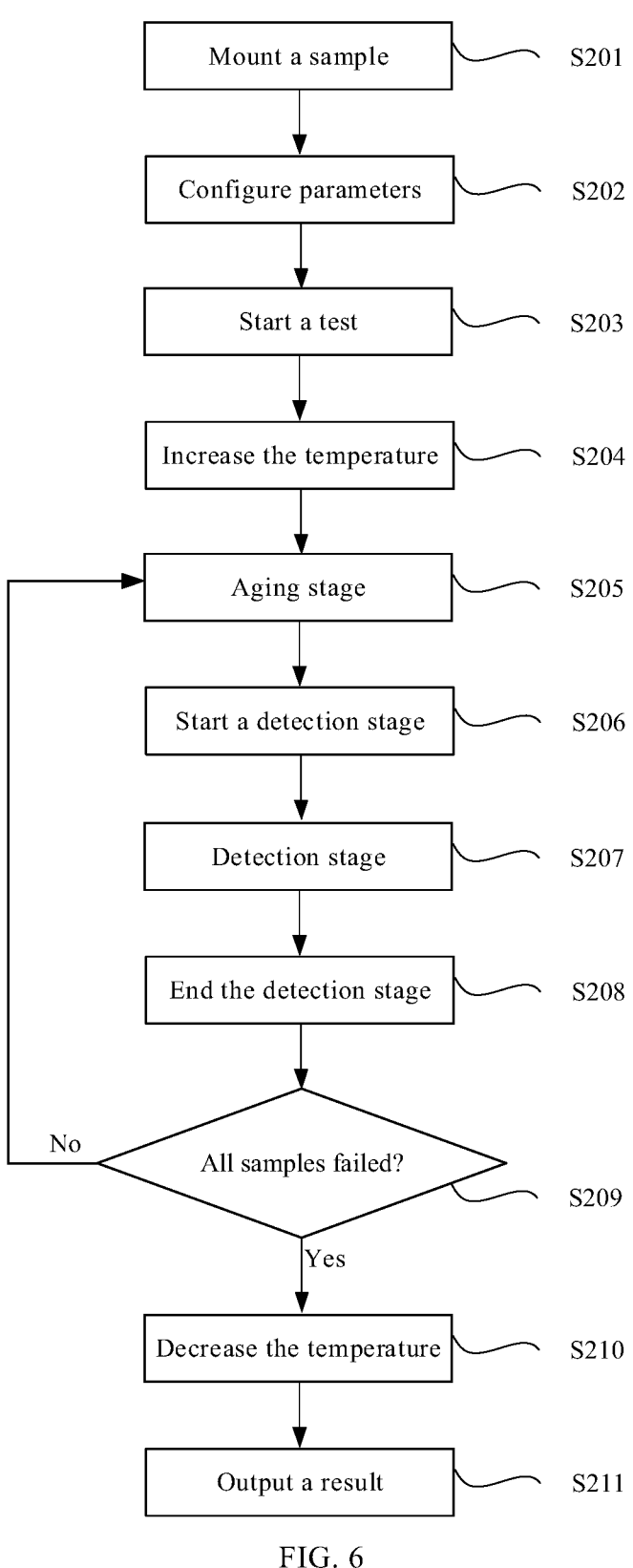
FIG. 6 is another flowchart of a method for soldering point aging test according to the present disclosure.

Referring to FIG. 6, in an exemplary implementation, the method may include the following operations S201 to S211.

At operation S201, a sample is mounted.

Each sample to be tested is mounted at a mounting position T of a test board (connection circuit) which is placed on a stage in an oven (heater).

At operation S202, parameters are configured.

Conditions of aging test, such as a heating rate, a heat preservation temperature (temperature stress), a cooling rate, a current applied to the sample (current stress), the number of samples, the number of aging stages, a preset duration of each aging stage, a sample failure criterion (such as a resistance value that counts as failure) and the like, are input via an interactive interface of a terminal (control unit).

At operation S203, a test is started.

A test is started via the interactive interface of the terminal.

At operation S204, the temperature is increased.

Referring to FIG. 3, the terminal outputs a control signal 1 (indicated by "signal 1" in the figure) via a bus, to control the oven to increase the temperature at the set temperature rate, until the heat preservation temperature is reached.

At operation S205, an aging stage is implemented.

Referring to FIGS. 3 and 4, the terminal outputs a control signal 2 (indicated by "signal 2" in the figure) via the bus, to control a plurality of constant current power supplies (power supply units) to be turned on, the power switch K1 to be turned on, the detection switch K2 to be turned off, and the connection switch S of the connection branch where each sample to be tested is located to be turned on, so that a current flows through each sample to be tested, and aging of the soldering point in the sample is accelerated under the action of the current stress and the temperature stress.

At operation S206, a detection stage is started.

Referring to FIGS. 3 and 4, when the aging stage lasts for a preset time length, the terminal outputs a control signal 3 (indicated by "signal 3" in the figure) via the bus, to control the power switch K1 to be turned off, the detection switch K2 to be turned on, a resistance detection device (detection unit) to be connected to the connection circuit, and all the connection switches S to be temporarily turned off.

At operation S207, the detection stage is implemented.

Referring to FIG. 4, the terminal controls the connection switches S of the connection branches where the samples to be tested are located to be turned on one by one. In other words, only one connection switch S is turned on at a time, and each connection switch S of the connection branch where a sample to be tested is located is turned on once.

When the connection switch S of each connection branch is turned on, a resistance detection device performs a detection on a resistance of the sample on the connection branch, and records a corresponding resistance value.

In FIG. 4, the number in the "( )" after "S" indicates the number of each of the connection switches S, that is, there are n connection switches S in total.

Referring to FIG. 4, in order for a stable detection, when the turned on connection switch S is to be switched, all the connection switches S may be turned off simultaneously for a short time (that is, a next connection switch S is turned on after a previous connection switch S has been turned off for a certain time period).

At operation S208, the detection stage is ended.

Referring to FIG. 4, when the detection on each of the samples to be tested currently is completed, the terminal controls the detection switch K2 and all the connection switches S to be turned off.

At operation S209, a judgment is fed back.

The resistance detection device compares each resistance value detected in the detection stage with a preset failure criterion, determines a new failed sample (i.e., a sample firstly found to be failed in the detection), and feeds back information on the new failed sample (a position of the sample on the test board, time of failure) to the terminal.

The terminal excludes the new failed sample from the samples to be tested, and keeps the connection switch S of the connection branch where the failed sample is located off in the subsequent process of the test.

For example, referring to FIG. 4, a sample corresponding to S (2) (i.e., a second connection switch S) is found to be failed in a second detection stage, so the second connection switch S remains off since then on.

The terminal judges whether all samples are failed: if not all samples are failed, the process returns to operation S205, and if all samples are failed, the process proceeds to a next operation.

At operation S210, the temperature is decreased.

When all samples are failed, referring to FIG. 3, the terminal sends the control signal 1 again, to control the oven to decrease the temperature according to a preset cooling rate.

At operation S211, a result is output.

The terminal records and processes the received detected data, and outputs a report form of the test result.

Many specific operations in the above method may vary.

For example, before and after the detection stage, and when the turned on connection switch S is switched, all the connection switches S are turned off to keep the system stable, but it is also possible to perform the method without this operation. For another example, each detection stage may be implemented at a room temperature, so that the temperature is decreased before each detection stage (correspondingly, the temperature is increased before each aging stage). For another example, the resistance detection device may directly send all the detected data (resistance values) to the terminal, and the terminal determines which samples are failed and records the specific resistance value of each sample, or the like.

The present disclosure has disclosed example implementations, and although specific terms are employed, they are used and should be interpreted merely in a generic and descriptive sense, not for purposes of limitation. In some instances, as would be apparent to one skilled in the art, features, characteristics and/or elements described in connection with a particular implementation may be used alone or in combination with features, characteristics and/or elements described in connection with another implementation, unless expressly stated otherwise. It will, therefore, be understood by those skilled in the art that various changes in form and details may be made therein without departing from the scope of the present disclosure as set forth in the appended claims.

What is claimed is:

1. A test apparatus, comprising:
a connection circuit having a plurality of mounting positions each configured to connect a sample;
a detection unit configured to perform a detection on the sample;
a control unit configured to control the detection unit to perform the detection on the sample; and
a power supply unit configured to supply power to the connection circuit,
wherein the control unit is further configured to control the power supply unit to supply power to the connection circuit, and control the power supply unit to be disconnected from the connection circuit when the detection unit performs the detection, and wherein the connection circuit comprises a plurality of parallel connection branches each provided with a mounting position and a connection switch in series, and
wherein the control circuit is configured to turn on connection switches one by one, so as to perform the detection on samples of the plurality of parallel connection branches one by one, and wherein a next connection switch is turned on after a previous connection switch has been turned off for a certain time period.

2. The test apparatus according to claim 1, wherein the detection unit is configured to detect a resistance of the sample.

3. The test apparatus according to claim 1, wherein the power supply unit comprises a constant current power supply.

4. The test apparatus according to claim 3, wherein the control unit is further configured to control an output current of the constant current power supply.

5. The test apparatus according to claim 4, wherein the control unit is configured to control the output current of the constant current power supply according to a number of samples.

6. The test apparatus according to claim 1, wherein the control unit is configured to control the detection unit to be disconnected from the connection circuit when the power supply unit supplies power.

7. A test method, comprising:
connecting a sample to a mounting position of a test apparatus, wherein the test apparatus is the test apparatus according to claim 1; and
performing a test on the sample with the test apparatus.

8. The test method according to claim 7, wherein the power supply unit comprises a constant current power supply.

9. The test method according to claim 8, wherein the control unit is further configured to control an output current of the constant current power supply.

10. The test method according to claim 9, wherein the control unit is configured to control the output current of the constant current power supply according to a number of samples.

11. The test method according to claim 7, wherein the control unit is configured to control the detection unit to be disconnected from the connection circuit when the power supply unit supplies power.

12. The test method according to claim 7, wherein the detection unit is configured to detect a resistance of the sample.

* * * * *